US009671973B2

(12) United States Patent
Zhang

(10) Patent No.: US 9,671,973 B2
(45) Date of Patent: Jun. 6, 2017

(54) DATA STORAGE IN DEGRADED SOLID STATE MEMORY

(71) Applicant: Empire Technology Development LLC, Wilmington, DE (US)

(72) Inventor: Tong Zhang, Watervliet, NY (US)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 80 days.

(21) Appl. No.: 14/651,091

(22) PCT Filed: Dec. 20, 2013

(86) PCT No.: PCT/US2013/077005
§ 371 (c)(1),
(2) Date: Jun. 10, 2015

(87) PCT Pub. No.: WO2015/094349
PCT Pub. Date: Jun. 25, 2015

(65) Prior Publication Data
US 2016/0283117 A1    Sep. 29, 2016

(51) Int. Cl.
G11C 29/00    (2006.01)
G06F 3/06    (2006.01)
G11C 16/34    (2006.01)
G11C 29/12    (2006.01)
G11C 29/52    (2006.01)
(Continued)

(52) U.S. Cl.
CPC ............ *G06F 3/064* (2013.01); *G06F 3/0619* (2013.01); *G06F 3/0673* (2013.01); *G06F 11/1012* (2013.01); *G06F 11/1068* (2013.01); *G11C 16/349* (2013.01); *G11C 29/12* (2013.01); *G11C 29/52* (2013.01); *G11C 29/70* (2013.01);
(Continued)

(58) Field of Classification Search
CPC ......... G11C 29/12; G11C 29/52; G06F 3/064; G06F 3/069; G06F 3/0673; G06F 11/1012; G06F 11/1068; G06F 11/16349
See application file for complete search history.

(56) References Cited

U.S. PATENT DOCUMENTS 5,200,959 A    4/1993  Gross et al.
7,836,364 B1 *  11/2010  Sutardja ............... G06F 11/1068
                                                                365/200
(Continued)

OTHER PUBLICATIONS

"Bad Block Management in NAND Flash Memory," Micron Technology, pp. 1-9, Jul. 2010.
(Continued)

Primary Examiner — Esaw Abraham
(74) Attorney, Agent, or Firm — Moritt Hock & Hamroff LLP; Steven S. Rubin, Esq.

(57) ABSTRACT

Technologies are generally described for systems, devices, and methods effective to operate a memory device. A memory controller may compress initial data to produce compressed data. The memory controller may select a storage block in the memory device. The memory controller may identify one or more positions of defective cells in the selected storage block. The memory controller may manipulate the compressed data based on the identified one or more positions to produce manipulated data. The memory controller may store the manipulated data in the selected storage block.

12 Claims, 7 Drawing Sheets

(51) Int. Cl.
*G06F 11/10* (2006.01)
*G11C 29/04* (2006.01)

(52) U.S. Cl.
CPC ............... *G11C 2029/0409* (2013.01); *G11C 2029/0411* (2013.01)

(56) References Cited

U.S. PATENT DOCUMENTS

| | | | | |
|---|---|---|---|---|
| 7,900,102 B2* | 3/2011 | Sokolov | ............. | G06F 11/1072 714/719 |
| 7,924,648 B2* | 4/2011 | Sokolov | ................ | G06F 1/3203 365/189.011 |
| 8,000,141 B1* | 8/2011 | Shalvi | ................ | G11C 11/5628 365/185.09 |
| 8,239,735 B2* | 8/2012 | Shalvi | .................. | G11C 16/349 714/774 |
| 8,291,295 B2 | 10/2012 | Harari et al. | | |
| 8,295,109 B2 | 10/2012 | Sarin et al. | | |
| 8,339,853 B2 | 12/2012 | Tokiwa | | |
| 8,379,448 B2 | 2/2013 | Han et al. | | |
| 8,694,859 B2* | 4/2014 | Shalvi | .................. | G11C 16/349 714/763 |
| 8,769,374 B2* | 7/2014 | Franceschini | ....... | G06F 11/1048 714/763 |
| 8,854,882 B2* | 10/2014 | Strasser | .............. | G06F 11/1048 365/185.03 |
| 9,329,948 B2* | 5/2016 | Li | ....................... | G06F 11/1666 |
| 2009/0164704 A1 | 6/2009 | Kanade et al. | | |
| 2010/0115376 A1 | 5/2010 | Shalvi et al. | | |
| 2011/0041039 A1 | 2/2011 | Harari et al. | | |
| 2011/0138104 A1 | 6/2011 | Franceschini et al. | | |

OTHER PUBLICATIONS

Cardarilli, G.C., et al., "Design of a Fault Tolerant Solid State Mass Memory," IEEE Transactions on Reliability, vol. 52, No. 4, pp. 476-491, Dec. 2003.

Huang, H.H., et al., "Performance Modeling and Analysis of Flash-based Storage Devices," 2011 IEEE 27th Symposium on Mass Storage Systems and Technologies (MSST), pp. 1-11, May 23-27, 2011.

International Search Report and Written Opinion for International Application No. PCT/US13/77005 mailed May 28, 2014, 12 pages.

* cited by examiner

DATA STORAGE IN DEGRADED SOLID STATE MEMORY

CROSS-REFERENCE TO RELATED APPLICATION

This application is a U.S. National Stage filing under 35 U.S.C. §371 of International Application No. PCT/US13/77005 filed on Dec. 20, 2013. The disclosure of the International Application is hereby incorporated herein by reference in its entirety.

BACKGROUND

Unless otherwise indicated herein, the materials described in this section are not prior art to the claims in this application and are not admitted to be prior art by inclusion in this section.

Solid state data storage devices may be used in an information technology infrastructure to handle intensive data access workloads. A solid state storage device may include a multitude of transistors controlled by a solid state memory controller. Each transistor may be configured to store one bit of data. The solid state memory controller may be configured to control access to data stored within transistors. Transistors may have a limited number of program/erase cycles before such transistors degrade.

SUMMARY

In one example, methods to operate a memory device are generally described. The methods may include compressing received initial data to produce compressed data. The methods may further include selecting a storage block in the memory device. The methods may further include identifying one or more positions of defective cells in the selected storage block. The methods may further include manipulating the compressed data. The compressed data may be manipulated based on the identified one or more positions to produce manipulated data. The methods may further include storing the manipulated data in the storage block.

In one example, methods to operate a memory device are generally described. The methods may include identifying a speed used to write to the memory device. The methods may further include identifying a number of errors associated with the identified speed. The methods may further include identifying an error correction code level of an error correction code module. The methods may further include selecting a storage block in the memory device with a number of defective cells. Selecting the storage block may be based on the identified error correction code level, the identified number of errors associated with the speed, and the identified number of defective cells. The methods may further include writing to the selected storage block.

In one example, memory devices are generally described. The memory devices may include a memory controller and a memory chip configured to be in communication with the memory controller. The memory controller may be effective to, or to cause one or more other devices to be effective to compress initial data to produce compressed data. The memory controller may be further effective to, or to cause the one or more other devices to be effective to select a storage block in the memory chip. The memory controller may be further effective to, or to cause the one or more other devices to be effective to identify one or more positions of defective cells in the selected storage block. The memory controller may be further effective to, or to cause the one or more other devices to be effective to manipulate the compressed data based on the identified one or more positions to produce manipulated data. The memory controller may be further effective to, or to cause the one or more other devices to be effective to store the manipulated data in the selected storage block.

In one example, memory devices are generally described. The memory devices may include a memory controller and a memory chip configured to be in communication with the memory controller. The memory controller may be effective to, or to cause one or more other devices to be effective to identify a speed used to write to the memory chip. The memory controller may be further effective to, or to cause the one or more other devices to be effective to identify a number of errors associated with the identified speed. The memory controller may be further effective to, or to cause the one or more other devices to be effective to identify an error correction code level of an error correction code module. The memory controller may be further effective to, or to cause the one or more other devices to be effective to select a storage block in the memory chip with a number of defective cells. The storage block may be selected based on the identified error correction code level, the identified number of errors associated with the speed, and the identified number of defective cells. The memory controller may be further effective to, or to cause the one or more other devices to be effective to write to the selected storage block.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
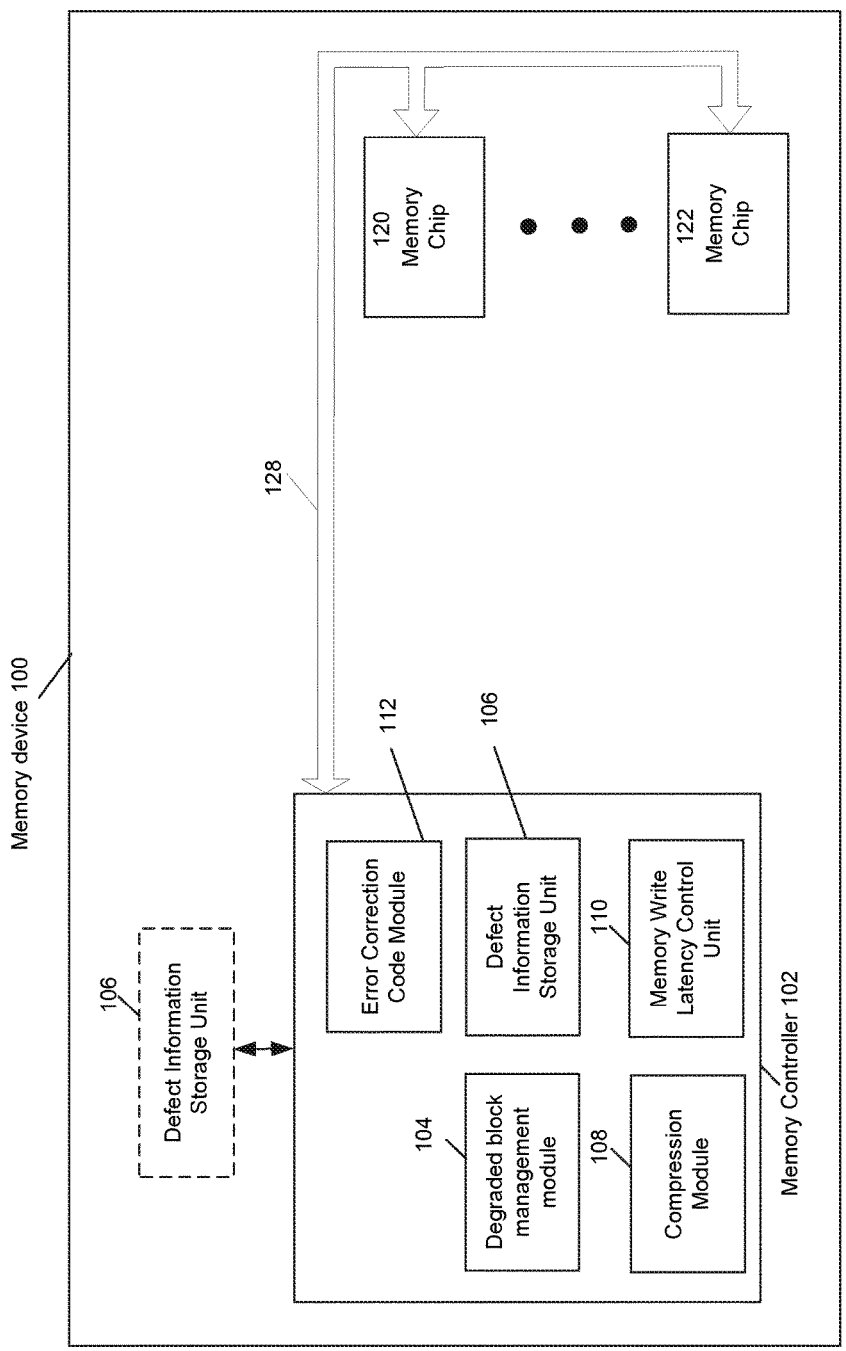
FIG. 1 illustrates an example system that can be utilized to implement data storage in degraded solid state memory.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the drawings, can be arranged, substituted, combined, separated, and designed in a wide variety of different configurations.

This disclosure is generally drawn to, inter alia, methods, apparatus, systems, devices, and computer program products related to data storage in degraded solid state memory.

Briefly stated, technologies are generally described for systems, devices, and methods effective to operate a memory device. A memory controller may compress initial data to produce compressed data. The memory controller may select a storage block in the memory device. The memory controller may identify one or more positions of defective cells in the selected storage block. The memory controller may manipulate the compressed data based on the identified one or more positions to produce manipulated data. The memory controller may store the manipulated data in the selected storage block.

FIG. 1 illustrates an example system that can be utilized to implement data storage in degraded solid state memory, arranged in accordance with at least some embodiments described herein. An example memory device 100 may include a memory controller 102. Memory device 100 may include one or more chips. Memory controller 102 may be a dedicated chip or may be integrated into another chip, such as a microprocessor. Memory controller 102 may control reads and/or writes (sometimes referred to as "store", "stores" or "storage") of one or more memory chips 120, 122. Memory chips 120, 122 may be, for example, solid state or flash memory where transistors are configured in a NAND or NOR configuration. Memory controller 102 may be configured in communication with memory chips 120, 122 by a system link 128. System link 128 may be, for example, a bus or other form of communication within memory device 100.

Memory controller 102 may include a degraded block management module 104, a defect information storage unit 106, a compression module 108, a memory write latency control unit 110 and/or an error correction code module 112 all configured to be in communication with one another. Degraded block management module 104 may be implemented in hardware, and/or a combination of hardware and instructions executable on hardware. Degraded block management module 104 may be configured to control access by memory controller 102 to one or more degraded blocks in memory chips 120, 122. A degraded block may be a block in memory chips 120, 122 with one or more defective cells. A defective cell may be a transistor that is no longer able to reliably store data. For example, memory controller 102 may perform memory testing before a respective flash memory is used and track bit error statistics. Defect information storage unit 106 may be implemented in hardware, and/or a combination of hardware and instructions executable on hardware. Defect information storage unit 106 may be configured to store information related to defective cells within memory chips 120, 122. For example, defect information storage unit 106 may store the location of defective cells in memory chips 120, 122. Defect information storage unit 106 may be located in memory controller 102 or on a separate chip. For example, defect information storage unit 106 may be stored in SRAM (static random access memory) in memory controller 102. In another example, defect information storage unit 106 may be stored at a location outside of memory controller 102 in, for example, DRAM (dynamic random access memory). In some examples, MRAM (magnetoresistive RAM) may be used in place of, or in conjunction with, SRAM or DRAM.

Compression module 108 may be implemented in hardware, and/or a combination of hardware and instructions executable on hardware. Compression module 108 may be configured to perform compression on input data. In an example, the compression may be a lossless compression. Compression may reduce the amount of data to be physically stored on memory chips 120, 122. For example, if ten logic "1"s are to be stored, compression module 108 may store the number "10" and a logic "1" in examples where such storage would require less transistors than ten instances of logic "1". Other compression techniques may be performed by compression module 108.

As will be discussed in more detail below, memory write latency control unit 110 may be implemented in hardware, and/or a combination of hardware and instructions executable on hardware. Memory write latency control unit 110 may be configured to adjust a memory write speed according to requirements of an operating system and/or one or more service level guarantees. Error correction code module 112 may be implemented in hardware and/or a combination of hardware and instructions executable on hardware, and may be configured to correct data storage or transmission errors within memory device 100. Error correction code module 112 may correct errors by, for example, adding and using redundant data (or "parity" data) to a string of bits. Adding redundant data may allow a bit to be recovered even when a number of errors were introduced during bit storage and/or transmission.

As discussed in more detail below, memory controller 102 may selectively store data in degraded blocks of memory chips 120, 122. In one example, compression may be used to reduce the size of data to be written to memory blocks. Redundancy data may be added to the bit stream of the compressed data. Redundancy data and compressed data may be stored in degraded blocks of memory chips 120 and/or 122. In another example, memory controller 102 may be configured to control memory writes to degraded blocks of memory chips 120 and/or 122 based on a workload intensity, a number of defective memory cells, an error rate, and/or based on some other factor(s) or combination thereof.

Figure 2:
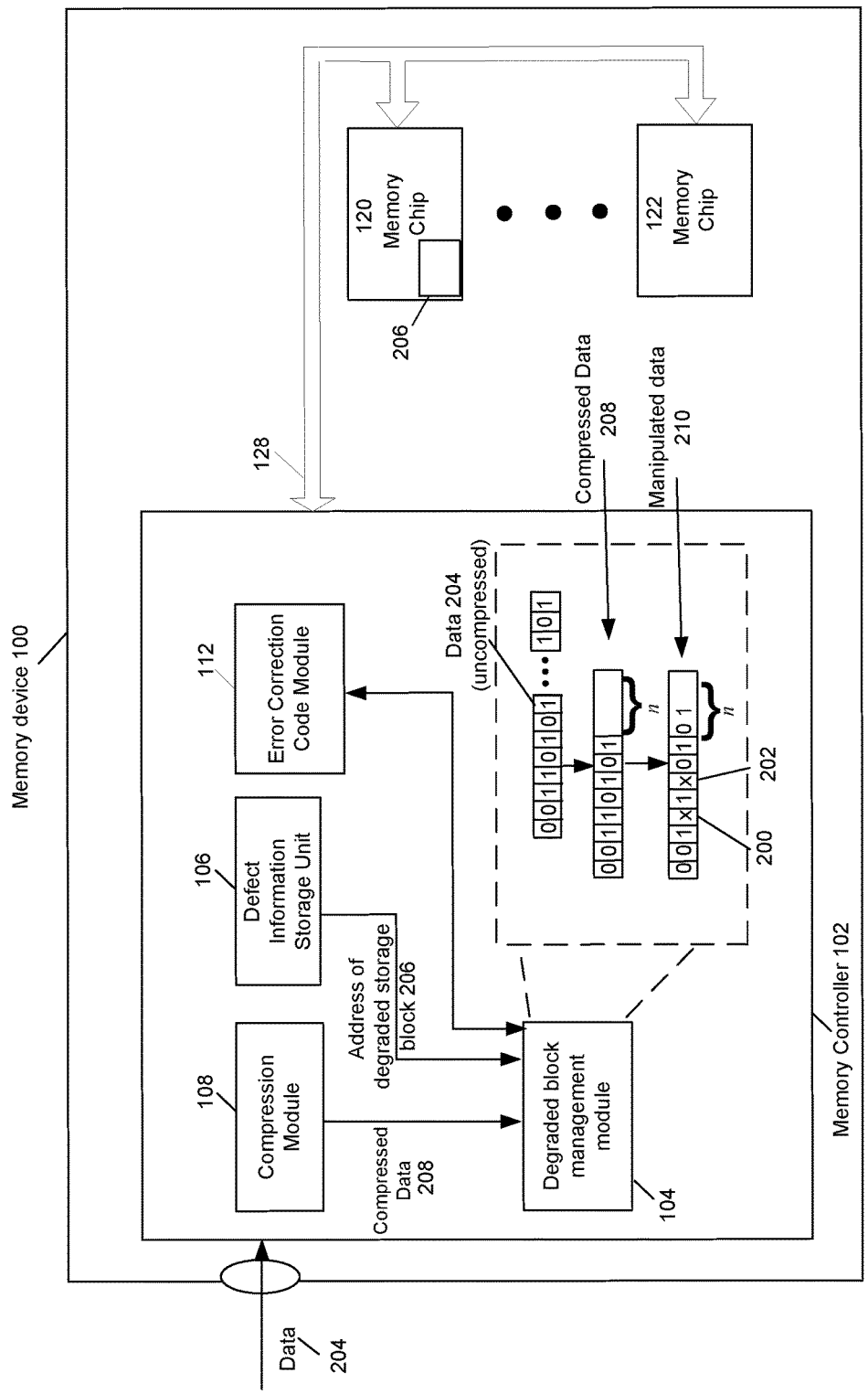
FIG. 2 depicts the example system of FIG. 1 illustrating additional details relating to a memory controller for the solid state memory.

FIG. 2 depicts the example system of FIG. 1 with additional details relating to a memory controller (such as memory controller 102), arranged in accordance with at least some embodiments described herein. Those components in FIG. 2 that are labeled identically to components of FIG. 1 will not be described again for the purposes of clarity and brevity.

In an example, memory controller 102 may receive a request to write data 204 in at least one of memory chips 120, 122. Compression module 108 may compress data 204 to produce compressed data 208. Data 204 may use m bits of storage space in a memory storage block. Compressed data 208 may use q bits of storage space in a memory storage block (sometimes "storage block"). The compression may indicate that compressed data 208 has been compressed by n bits (e.g., m−q=n). Compressed data 208 may use n bits fewer unoccupied storage space for storage within a data storage block, relative to data 204. In an example, prior to compression, memory controller 102 may receive data 204. Data 204 may be 4 kb of data to be stored in at least one of memory chips 120, 122. Compression module 108 may compress the 4 kb of data 204 into 3.8 kb of compressed data 208. In the example, the data has been compressed by n=200 bytes (e.g., 4 kb−3.8 kb=200 bytes). Compressed data 208 may thus use n=200 bytes fewer unoccupied storage space in memory chips 120 and/or 122. Compression thus may increase an amount of available unoccupied storage space in memory chips when compressed data 208 is stored in memory chips.

After compression, defect information storage unit 106 may identify a degraded storage block 206 in memory of memory chip 120. In an example, degraded storage block 206 may have n bytes or less of defective cells (e.g., n≥#_defective cells). Defect information storage unit 106 may then provide the memory address of degraded storage block 206, including the positions of the defective cells, to degraded block management module 104.

After identification of degraded storage block 206, error correction code module 112 may perform error correction code encoding on compressed data 208. Error correction code encoding may involve adding redundancy data to compressed data 208. Degraded block management module 104 may insert dummy bits into the bit stream of compressed data 208 at positions corresponding to defective cells of degraded storage block 206, so as to produce manipulated data 210.

Insertion of dummy bits may shift bits in the bit stream of compressed data 208. Degraded block management module 104 may store an error correction code in association with write manipulated data 210 in degraded storage block 206. In an example, degraded storage block 206 may include defective cells at position 200 and at position 202. Degraded block management module 104 may insert dummy bits at positions 200 and 202. Dummy bits may be assigned an arbitrary value, represented in FIG. 2 as "x." Insertion of the two dummy bits at positions 200 and 202 may cause subsequent bits in the bit stream to be shifted. For example, with reference to FIG. 2, bits in manipulated data 210 are shifted, compared to bits in compressed data 208, due to the insertion of dummy bits 200 and 202.

When memory controller 102 reads manipulated data 210 from degraded storage block 206, degraded block management module 104, in conjunction with defect information storage unit 106, may remove the dummy bits to reproduce compressed data 208. Error correction code module 112 may then decode compressed data by use of the error correction code. Compression module 108 may be further configured to decompress compressed data 208 to reproduce data 204. Degraded storage block 206 may still be used.

Figure 3:
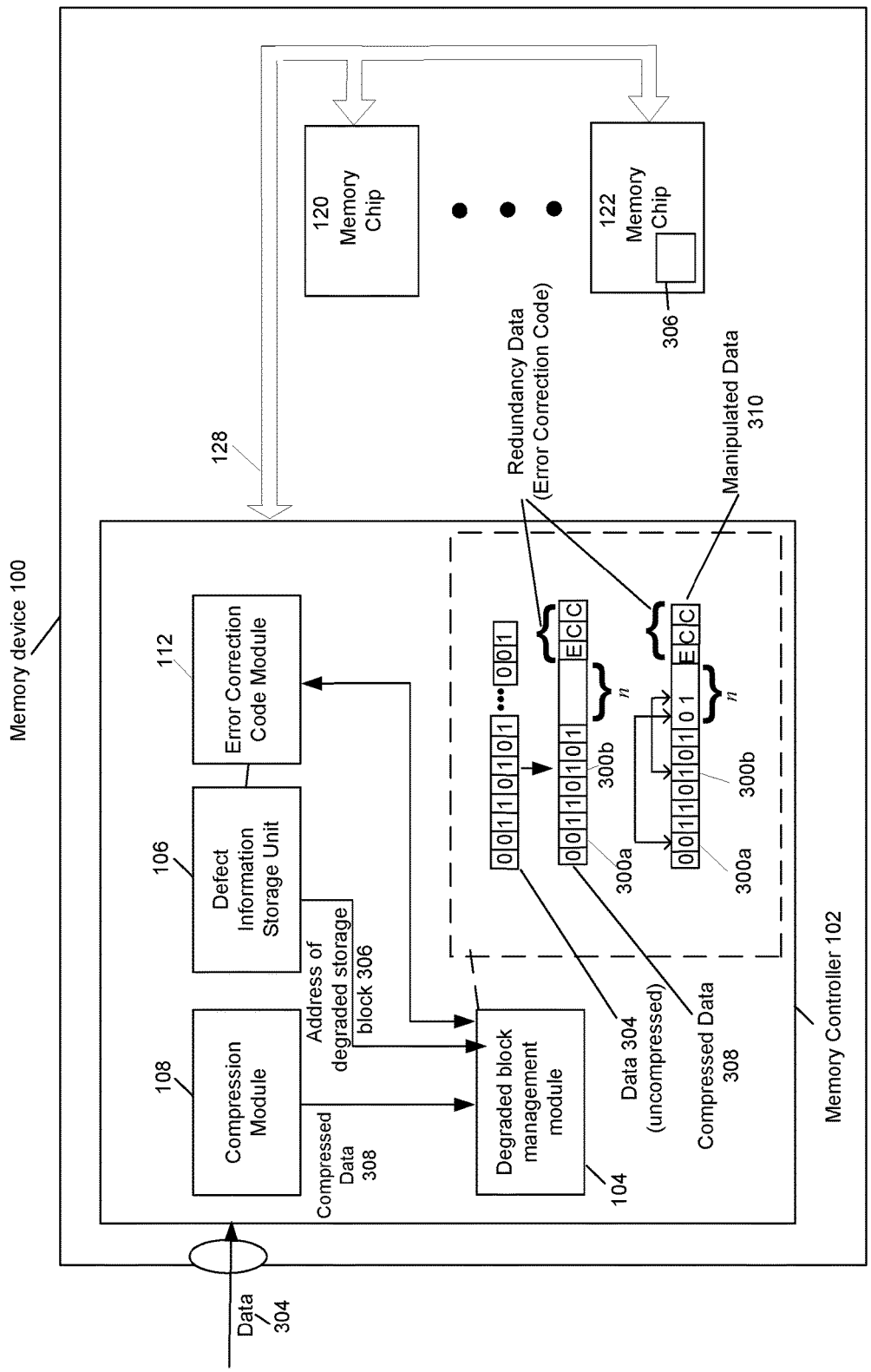
FIG. 3 depicts the example system of FIG. 1, illustrating an example relating to a degraded block management module for the solid state memory.

FIG. 3 depicts the example system of FIG. 1 illustrating an example relating to a degraded block management module (such as degraded block management module 104), arranged in accordance with at least some embodiments described herein. Those components in FIG. 3 that are labeled identically to components of FIGS. 1 and 2 will not be described again for the purposes of clarity and brevity.

In an example, memory controller 102 may receive a request to store data 304 in at least one of memory chips 120, 122. Compression module 108 may compress data 304 to produce compressed data 308. Compressed data 308 may require n bits fewer unoccupied storage space for storage in a storage block relative to data 304. For example, prior to compression, memory controller 102 may receive data 304. Data 304 may be 3.8 kb of data to be stored in at least one of memory chips 120, 122. Compression module 108 may compress the 3.8 kb of data into 3.5 kb of compressed data 308. In the example, the data has been compressed by n=300 bytes (e.g., 3.8 kb−3.5 kb=300 bytes).

After compression, defect information storage unit 106 may identify a degraded storage block 306 in memory of memory chip 122. Degraded storage block 306 may have n bytes or less of defective cells (e.g., n≥#_defective_cells). In the example, defect information storage unit 106 may identify that degraded storage block 306 has 250 bytes worth of defective cells. As 250<n (=300), defect information storage unit 106 may select degraded storage block 306 to store compressed data 308 after manipulation, as discussed below. Defect information storage unit 106 may provide the memory address of degraded storage block 306, including the positions of the defective cells, to degraded block management module 104.

After selection of degraded storage block 306, error correction code module 112 may perform error correction code encoding to compressed data 308. Degraded block management module 104 may identify bits of compressed data 308 that correspond to positions of defective cells of degraded storage block 306. Degraded block management module 104 may copy and append the identified bits to the end of the bit stream of compressed data 308 to produce manipulated data 310 including appended bits. For example, with reference to FIG. 3, bits at defective positions 300a and 300b ("0" and "1," respectively) of compressed data 308 may be copied and appended to the end of the bit stream of compressed data 308 to produce manipulated data 310. Space may be available to copy the identified bits because of, in part, compression performed by compression module 108. Degraded block management module 104 may then store an error correction code in association with manipulated data 310 in degraded storage block 306.

When memory controller 102 reads manipulated data 310 from degraded storage block 306, error correction code module 112 may decode the encoded data with use of the error correction code. For each bit position, error correction code module 112 may determine whether the decoding is successful. If the decoding is successful, error correction code module 112 may continue to sequentially decode manipulated data 310.

If error correction code module 112 determines that the decoding failed, degraded block management module 104 may replace values of bits stored in defective cells and read values of corresponding bits appended at the end of the bit stream. For example, with reference to FIG. 3, error correction code module 112 may determine that decoding of manipulated data 310 failed. Accordingly, error correction code module 112, in conjunction with degraded block management module 104 and defect information storage unit 106, may replace values of bits at defective positions 300a, 300b and read values of bits appended at the end of the bit stream for manipulated data 310. The replacement and reading is illustrated in FIG. 3 by a line and arrow.

Figure 4:
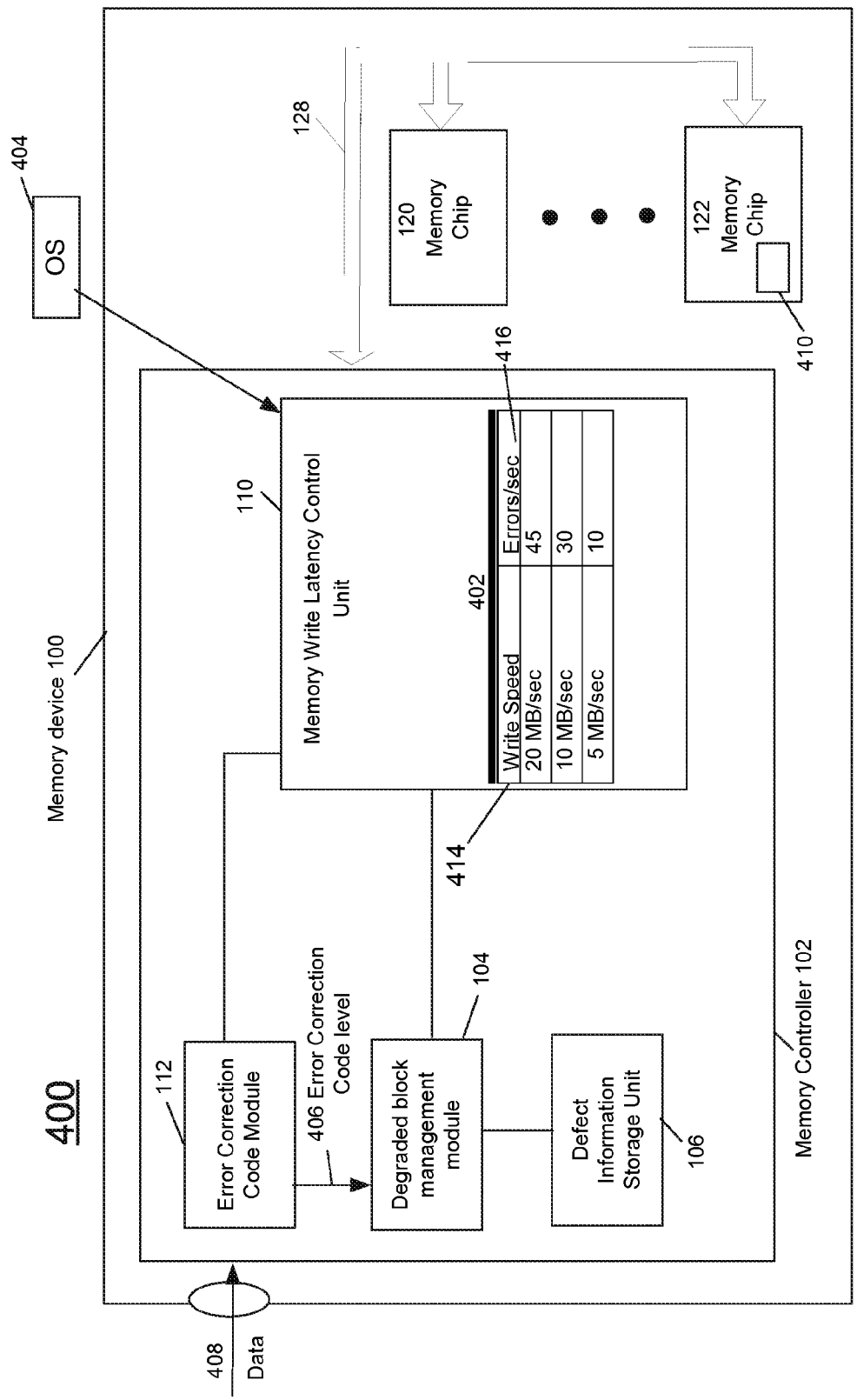
FIG. 4 depicts an example system 400 effective to implement data storage in degraded solid state memory.

FIG. 4 depicts an example system 400 effective to implement data storage in degraded solid state memory, arranged in accordance with at least some embodiments described herein. Those components in FIG. 4 that are labeled identically to components of FIGS. 1, 2 and 3 will not be described again for the purposes of clarity and brevity.

Example system 400 may include memory device 100 and an operating system ("OS") 404. Memory controller 102 may include memory write latency control unit 110. Memory write latency control unit 110 may store a table 402. Table 402 may include a write speed field 414 and an errors per second ("Errors/sec") field 416. The write speed may be a speed (e.g., bytes per second) at which data is written to memory chips 120, 122. The errors per second may be a number of correctable write errors that may be experienced for each block for a given time period (e.g., per second or per millisecond). The number of correctable errors per second may correspond to a write speed.

Operating system 404 may send instructions to write data to memory controller 102. In system 400, a workload intensity may fluctuate. A workload intensity may be, for example, an amount of resources required to be allocated to meet various service level guarantees. For example, during peak processing times, memory device 100 may be required to write to memory chips 120, 122 at a higher rate relative to periods of lower intensity in order to satisfy various service level guarantees.

The rate at which data is written to memory chips 120, 122 may be proportional or otherwise related to a number of write errors per second. Write errors per second may be a number of incorrectly stored bits within a time interval of one second. For example, while writing to memory chips 120, 122 at a speed of 10 MB/sec, memory device 100 may experience 30 errors per second. In the example, only 10 errors per second may be experienced at a write speed of 5 MB/sec. Error correction code module 112 may be configured to correct a certain number, or percentage of, memory write and/or read errors. In an example, the error correction code of error correction code module 112 may be configured to correct 30 errors per second. The number of errors that error correction code module 112 may be configured to correct may be an error correction code level 406.

Table 402 may associate a particular write speed with a number of write errors per second. Table 402 may be a data structure stored in one or more of memory chips 120, 122 or in another memory. Memory write latency control unit 110 may be configured to determine a workload intensity of system 400. Memory write latency control unit may determine workload intensity by, for example, communicating with operating system 404. In an example, during periods of peak processing, such as during normal business hours, memory device 100 may experience a relatively high workload intensity requiring high data write speeds. Conversely, during overnight or non-business hours, memory device 100 may experience a reduced workload intensity.

Based on the workload intensity, memory write latency control unit 110 may determine a maximum or otherwise increased memory write speed at which memory controller 102 can store data with a number of write errors less than error correction code level 406. For example, based on a current level of workload intensity, memory write latency control unit 110 may determine that the lowest memory write speed available to meet service level requirements may be 20 MB/sec. Based on the first row of table 402, memory write latency control unit 110 may determine that at a write speed of 20 MB/sec, 45 write errors per block may occur. Degraded block management module 104 may receive the determined write errors per block. Degraded block management module 104 may receive error correction code level 406 from error correction code module 112. Based on write errors per block and error correction code level 406, degraded block management module 104 may be configured to determine whether a degraded block 410 of memory in chip 122 may be used to store data at the required write speed. Degraded block of memory 410 in turn, may have a number of defective cells.

In an example, if degraded block management module 104 determines that error correction code level 406 is greater than, or equal to, the identified number of errors per second plus the number of defective cells in a degraded storage block, degraded block management module 104 may determine that the degraded storage block of memory may be used. If error correction code level 406 is equal to the number of errors per second, degraded block management module 104 may determine that a degraded storage block of memory may not be used. If error correction code level 406 is less than the errors per second, degraded block management module 104 and/or memory write latency control unit 110 may determine that a lower write speed is required.

In an example, memory controller 102 may receive a request to store data 408. Based on a current level of workload intensity, memory write latency control unit 110 may determine that a memory write speed of 10 MB/sec is required. Based on the second row of write speed/error table 402, memory write latency control unit 110 may determine that at a write speed of 10 MB/sec, 30 errors per second will occur. Degraded block management module 104 may receive the determined errors per second and error correction code level 406 from error correction code module 112. In the example, error correction code level 406 may be 40 errors/second. As error correction code level 406 (configured to correct 40 errors/second) is greater than the number of errors per second (30 errors per second at a write speed of 10 MB/sec), degraded block management module 104 may determine that a degraded block of memory chip 120 or memory chip 122 may be used to store the data 408.

Continuing with the example, degraded block management module 104 may query defect information storage unit 106 for a degraded block of memory chip 120 or memory chip 122. Defect information storage unit 106 may select a degraded block with 10 or fewer defective cells. A degraded block with 10 or fewer defective cells may be selected to ensure that the number of defective cells of the degraded block plus the number of errors per second is less than or equal to the error correction code level 406. In the current example, defect information storage unit 106 may determine that degraded block 410 of memory chip 122 has 10 or fewer defective cells. Accordingly, defect information storage unit 106 may select degraded block 410 (e.g., 10+30=40) for storage of data. Error correction code module 112 may encode data 408 and degraded block management module 104 may write data 408 in degraded block 410.

Among other possible features, a system in accordance with the disclosure may maximize or otherwise increase usage of memory blocks. Defective cells may otherwise result in an entire block of memory not being utilized for data storage. A system may maximize or otherwise increase memory usage of memory blocks by, for example, adjusting the memory write speed based on an amount of degradation and a strength of an error correction code. Advantageously, degraded memory blocks may be used for data storage at times when fast write speeds are not required.

Figure 5:
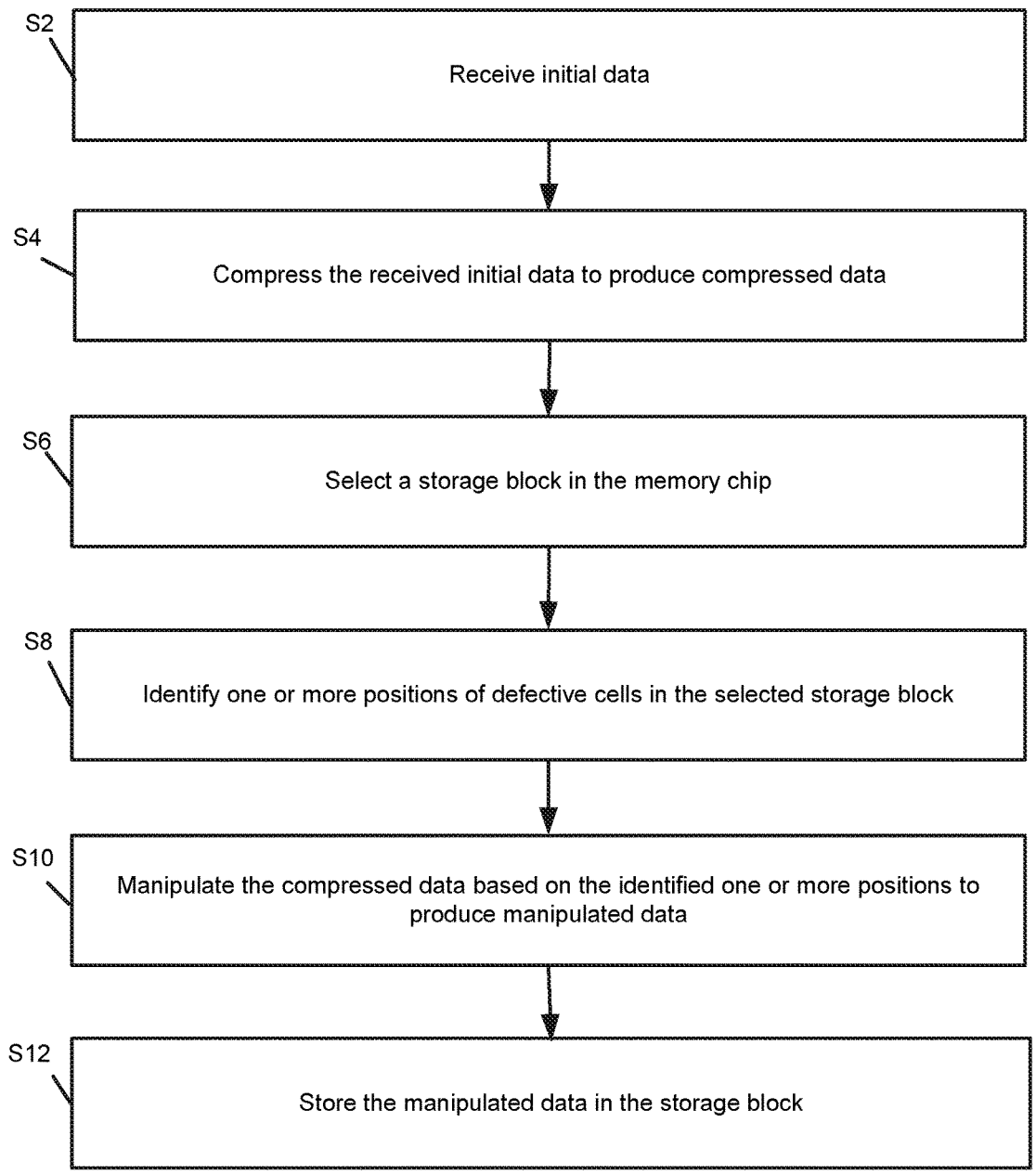
FIG. 5 depicts a flow diagram for an example process to implement data storage in degraded solid state memory.

FIG. 5 depicts a flow diagram for an example process to implement data storage in degraded solid state memory, arranged in accordance with at least some embodiments described herein. In some examples, the process in FIG. 5 could be implemented using memory device 100 discussed above and could be used to implement data storage in degraded solid state memory. An example process may include one or more operations, actions, or functions as illustrated by one or more of blocks S2, S4, and/or S6, etc. Although illustrated as discrete blocks, various blocks may be divided into additional blocks, combined into fewer blocks, or eliminated, depending on the particular implementation. Blocks may be supplemented with additional blocks representing other operations, actions, or functions. The process in FIG. 5 may be used by a memory device that includes a memory controller, such as memory device 100 and memory controller 102 described above. The memory controller may be configured in communication with one or more flash memory chips.

Processing may begin at block S2, "Receive initial data." At block S2, initial data may be received by memory controller 102.

Processing may continue from block S2 to block S4, "Compress the received initial data to produce compressed data." At block S4, the received initial data may be compressed, for example, by compression module 108, to produce compressed data. Compressing the received initial data may include using a lossless compression technique. The compressed data may be encoded by error correction code module 112 to produce an error correction code. Compressing the received initial data to produce the compressed data may increase an amount of unoccupied storage space that may be available when data is stored in a selected storage block.

Processing may continue from block S4 to block S6, "Select a storage block in the memory chip." At block S6, a storage block in the memory chip may be selected by degraded block management module 104 and/or defect information storage unit 106.

Processing may continue from block S6 to block S8, "Identify one or more positions of defective cells in the selected storage block." At block S8, one or more positions of defective cells in the selected storage block may be identified by defect information storage unit 106. Selecting the storage block may include determining, by degraded block management module 104, that the identified number of defective cells is less than a number of cells available in the unoccupied storage space.

Processing may continue from block S8 to block S10, "Manipulate the compressed data based on the identified one or more positions to produce manipulated data." At block S10, the compressed data may be manipulated by degraded block management module 104 based on the identified one or more positions to produce manipulated data. Manipulating the compressed data may include inserting one or more dummy bits in the compressed data at locations corresponding to the identified one or more positions. Manipulating the compressed data may include storing by degraded block management module 104 one or more bits at the identified one or more positions and storing by degraded block management module 104 the one or more bits in an unoccupied storage space to produce one or more appended bits.

Processing may continue from block S10 to block S12, "Store the manipulated data in the storage block." At block S12, manipulated data may be stored by memory controller 102 in the storage block. The compressed data may be encoded by error correction code module 112 to produce an error correction code. The produced error correction code may be stored by memory controller 102 in the selected storage block in association with the manipulated data. The manipulated data may be read from the selected storage block by memory controller 102. Dummy bits may be removed from the manipulated data by degraded block management module 104 to re-produce the compressed data. The compressed data may be decoded by error correction code module 112 with use of the produced error correction code. A determination by error correction code module 112 may be made that decoding the manipulated data failed and one or more appended bits may be read by degraded block management module 104 from the selected storage block.

Figure 6:
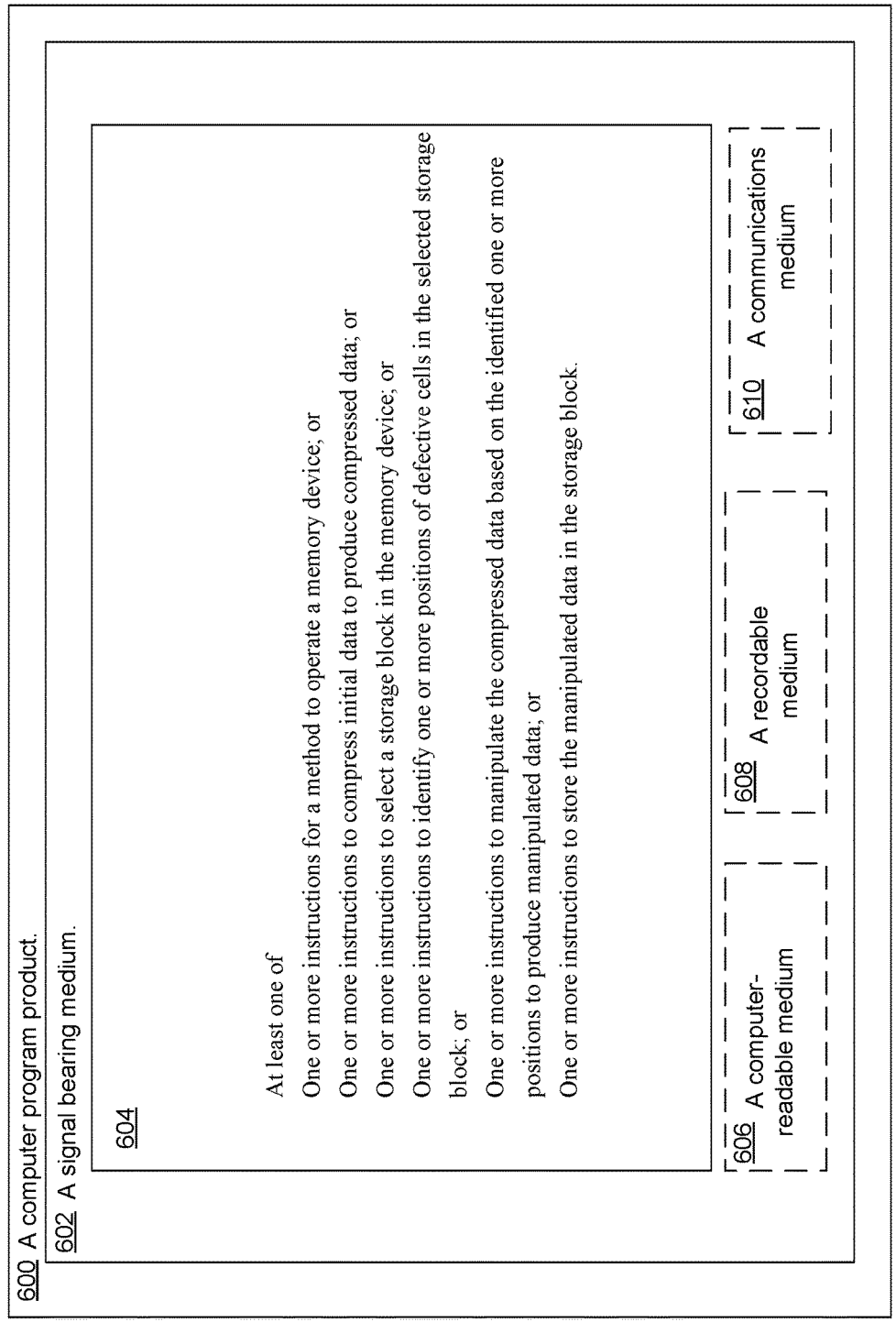
FIG. 6 illustrates an example computer program product that can be utilized to implement data storage in degraded solid state memory.

FIG. 6 illustrates an example computer program product 600 that can be utilized to implement data storage in degraded solid state memory arranged in accordance with at least some embodiments described herein. Computer program product 600 may include a signal bearing medium 602. Signal bearing medium 602 may include one or more instructions 604 that, in response to execution by, for example, a processor, may provide the functionality and features described above with respect to FIGS. 1-5. Thus, for example, referring to memory device 100, memory controller 102 may undertake one or more of the blocks shown in FIG. 6 in response to instructions 604 conveyed to memory device 100 by signal bearing medium 602.

In some implementations, signal bearing medium 602 may encompass a computer-readable medium 606, such as, but not limited to, a hard disk drive (HDD), a Compact Disc (CD), a Digital Video Disk (DVD), a digital tape, memory, etc. In some implementations, signal bearing medium 602 may encompass a recordable medium 608, such as, but not limited to, memory, read/write (R/W) CDs, R/W DVDs, etc. In some implementations, signal bearing medium 602 may encompass a communications medium 610, such as, but not limited to, a digital and/or an analog communication medium (e.g., a fiber optic cable, a waveguide, a wired communication link, a wireless communication link, etc.). Thus, for example, computer program product 600 may be conveyed to one or more modules of the memory device 100 by an RF signal bearing medium 602, where the signal bearing medium 602 is conveyed by a wireless communications medium 610 (e.g., a wireless communications medium conforming with the IEEE 802.11 standard).

Figure 7:
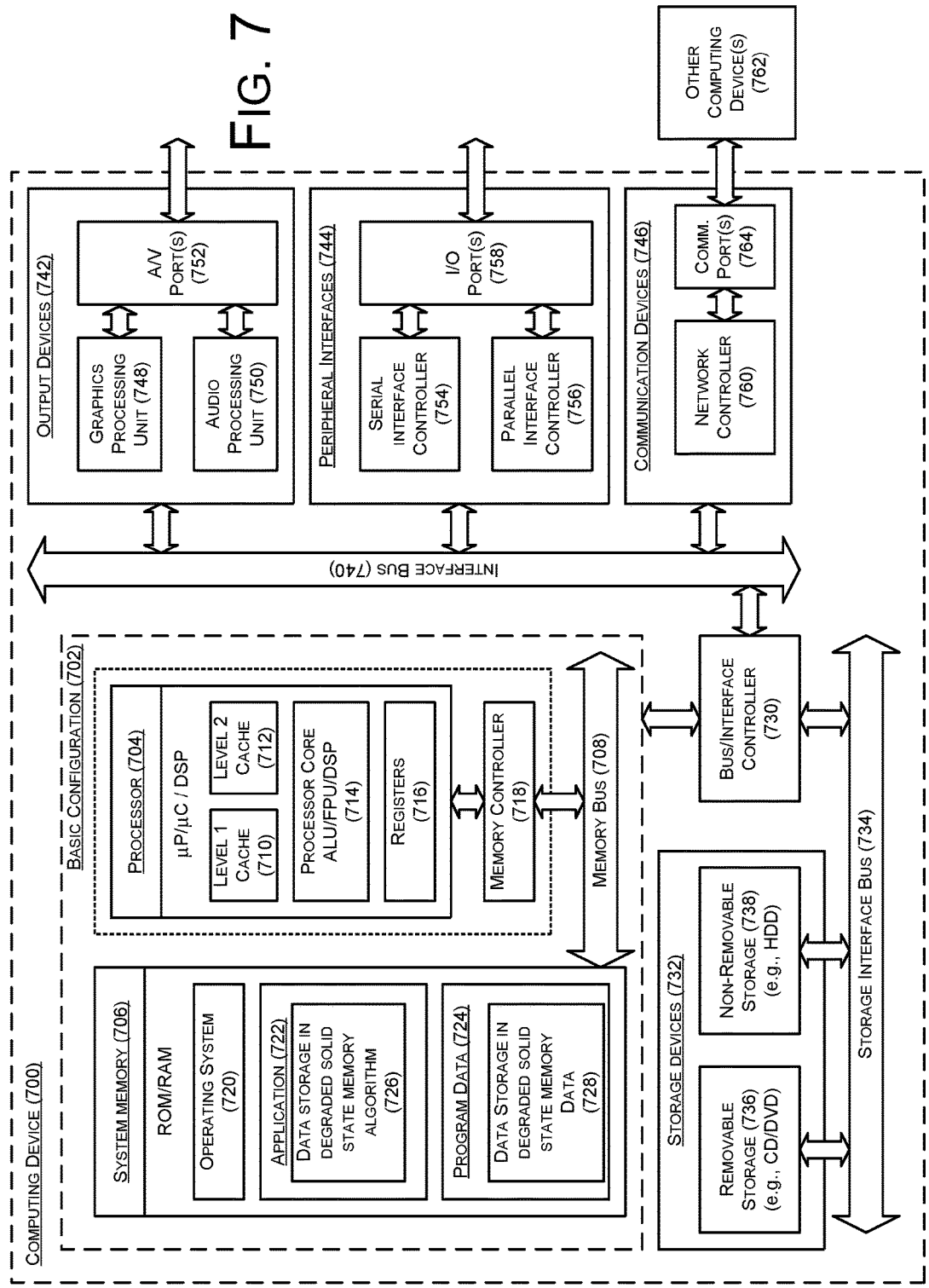
FIG. 7 is a block diagram illustrating an example computing device that is arranged to implement data storage in degraded solid state memory, all arranged according to at least some embodiments described herein.

FIG. 7 is a block diagram illustrating an example computing device 700 that is arranged to implement data storage in degraded solid state memory, arranged in accordance with at least some embodiments described herein. In a very basic configuration 702, computing device 700 typically includes one or more processors 704 and a system memory 706. A memory bus 708 may be used for communicating between processor 704 and system memory 706.

Depending on the desired configuration, processor 704 may be of any type including but not limited to a microprocessor (µP), a microcontroller (µC), a digital signal processor (DSP), or any combination thereof. Processor 704 may include one or more levels of caching, such as a level one cache 710 and a level two cache 712, a processor core 714, and registers 716. An example processor core 714 may include an arithmetic logic unit (ALU), a floating point unit (FPU), a digital signal processing core (DSP Core), or any combination thereof. An example memory controller 718 may also be used with processor 704, or in some implementations memory controller 718 may be an internal part of processor 704.

Depending on the desired configuration, system memory 706 may be of any type including but not limited to volatile memory (such as RAM), non-volatile memory (such as ROM, flash memory, etc.) or any combination thereof. System memory 706 may include an operating system 720, one or more applications 722, one or more programmable circuits 766 and program data 724. Application 722 may include a data storage in degraded solid state memory algorithm 726 that is arranged to perform the functions and operations as described herein, including those described with respect to FIGS. 1-6 in connection with memory device 100. Program data 724 may include data storage in degraded solid state memory data 728 that may be useful to implement data storage in degraded solid state memory as is described herein. In some embodiments, application 722 may be arranged to operate with program data 724 in cooperation with operating system 720 such that data storage in degraded solid state memory may be provided. This described basic configuration 702 is illustrated in FIG. 7 by those components within the inner dashed line.

Computing device 700 may have additional features or functionality, and additional interfaces to facilitate communications between basic configuration 702 and any required devices and interfaces. For example, a bus/interface controller 730 may be used to facilitate communications between basic configuration 702 and one or more data storage devices 732 via a storage interface bus 734. Data storage devices 732 may be removable storage devices 736, non-removable storage devices 738, or a combination thereof. Examples of removable storage and non-removable storage devices include magnetic disk devices such as flexible disk drives and hard-disk drives (HDDs), optical disk drives such as compact disk (CDs) drives or digital versatile disk (DVDs) drives, solid state drives (SSDs), and tape drives to name a few. Example computer storage media may include volatile and non-volatile, removable and non-removable media implemented in any method or technology for storage of information, such as computer readable instructions, data structures, program modules, or other data.

System memory 706, removable storage devices 736 and non-removable storage devices 738 are examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which may be used to store the desired information and which may be accessed by computing device 700. Any such computer storage media may be part of computing device 700.

Computing device 700 may also include an interface bus 740 for facilitating communication from various interface devices (e.g., output devices 742, peripheral interfaces 744, and communication devices 746) to basic configuration 702 via bus/interface controller 730. Example output devices 742 include a graphics processing unit 748 and an audio processing unit 750, which may be configured to communicate to various external devices such as a display or speakers via one or more A/V ports 752. Example peripheral interfaces 744 include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. An example communication device 746 includes a network controller 760, which may be arranged to facilitate communications with one or more other computing devices 762 over a network communication link via one or more communication ports 764.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 700 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 700 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, will be apparent from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to operate a memory device, the method comprising:
    identifying initial data to be stored in a memory;
    compressing the initial data to produce compressed data;
    selecting a storage block in the memory device;
    identifying one or more positions of defective cells in the selected storage block;
    manipulating the compressed data, by inserting one or more dummy bits in the compressed data at locations corresponding to the identified one or more positions of the defective cells, to produce manipulated data;
    storing the manipulated data in the selected storage block;
    encoding the compressed data to produce an error correction code;
    storing, in the selected storage block, the produced error correction code in association with the manipulated data;
    reading the manipulated data from the selected storage block;
    removing the one or more dummy bits from the manipulated data to re-produce the compressed data; and
    decoding the compressed data by use of the produced error correction code.

2. The method of claim 1, wherein compressing the initial data includes using a lossless compression technique.

3. The method of claim 1, wherein:
    compressing the initial data to produce the compressed data is performed such that the compression increases an amount of unoccupied storage space to be available in the memory when the manipulated data is stored in the selected storage block; and
    manipulating the compressed data includes:
        storing one or more bits at the identified one or more positions of the defective cells; and
        storing the one or more bits in the unoccupied storage space to produce one or more appended bits.

4. The method of claim 3, wherein the error correction code includes a first error correction code, the method further comprising:
    encoding the manipulated data to produce a second error correction code;
    storing, in the selected storage block, the produced second error correction code in association with the manipulated data;
    reading the manipulated data from the selected storage block; and
    decoding the manipulated data by use of the produced second error correction code.

5. The method of claim 4, further comprising:
    determining that decoding the manipulated data has failed; and
    based on the determination that decoding the manipulated data has failed, reading the one or more appended bits from the selected storage block.

6. The method of claim 1, wherein:
    compressing the initial data to produce the compressed data is performed such that the compression increases an amount of unoccupied storage space to be available when the manipulated data is stored in the selected storage block; and
    selecting the storage block includes determining that an identified number of the defective cells is less than a number of cells available in the unoccupied storage space.

7. An article of manufacture comprising a non-transitory computer-readable medium having stored thereon computer-executable instructions, which are executable by a controller to operate the controller to perform or cause to be performed the method of claim 1.

8. A memory device, comprising:
    a memory controller; and
    a memory chip configured to be in communication with the memory controller, wherein the memory controller is effective to, or cause one or more other devices to be effective to:
        identify initial data to be stored in the memory chip;
        compress the initial data to produce compressed data;
        select a storage block in the memory chip;
        identify one or more positions of defective cells in the selected storage block;

manipulate the compressed data, by insertion of one or more dummy bits at the identified one or more positions of the defective cells, to produce manipulated data;

store the manipulated data in the selected storage block;

encode the compressed data to produce an error correction code;

store, in the selected storage block, the produced error correction code in association with the manipulated data;

read the manipulated data from the selected storage block;

remove the one or more dummy bits from the manipulated data to re-produce the compressed data; and decode the compressed data with use of the produced error correction code.

9. The memory device of claim 8, wherein:

the compression of the initial data to produce the compressed data is performed such that the compression increases an amount of unoccupied storage space to be available when the manipulated data is stored in the selected storage block; and manipulation of the compressed data includes:
  storage of one or more bits at the one or more positions of the defective cells; and
  storage of the one or more bits in the unoccupied storage space to produce one or more appended bits.

10. The memory device of claim 9, wherein the error correction code includes a first error correction code, and wherein the memory controller is further effective to, or to cause the one or more other devices to be effective to:

encode the manipulated data to produce a second error correction code;

store, in the selected storage block, the produced second error correction code in association with the manipulated data;

read the manipulated data from the selected storage block; and decode the manipulated data by use of the produced second error correction code.

11. The memory device of claim 10, wherein the memory controller is further effective to, or to cause the one or more other devices to be effective to:

determine that the manipulated data could not be decoded by the produced second error correction code; and based on the determination that the manipulated data could not be decoded, read the one or more appended bits from the selected storage block.

12. The memory device of claim 8, wherein:

the compression of the initial data to produce the compressed data is performed such that the compression increases an amount of unoccupied storage space to be available when the manipulated data is stored in the selected storage block; and selection of the storage block includes a determination that a number of the defective cells is less than a number of cells available in the unoccupied storage space.

\* \* \* \* \*